United States Patent [19]

Hester et al.

[11] Patent Number: 4,893,036
[45] Date of Patent: Jan. 9, 1990

[54] DIFFERENTIAL SIGNAL DELAY CIRCUIT

[75] Inventors: Richard E. Hester, Eden Prairie, Minn.; Jerry R. Wahl, Woodland Park, Colo.

[73] Assignee: VTC Incorporated, Bloomington, Minn.

[21] Appl. No.: 232,285

[22] Filed: Aug. 15, 1988

[51] Int. Cl.⁴ ............................................. H03K 5/13
[52] U.S. Cl. .................................... 307/603; 307/605; 307/608; 307/591; 307/592; 307/597
[58] Field of Search ............... 307/603, 605, 593, 597, 307/261, 263, 265, 608, 591, 592; 328/35, 55, 58, 181, 185

[56] References Cited

U.S. PATENT DOCUMENTS

| 2,939,969 | 6/1960 | Kwap et al. | 307/608 |
| 3,351,776 | 11/1967 | Chin | 307/603 |
| 3,868,519 | 2/1975 | Green | 307/270 |
| 4,009,398 | 2/1977 | Yamada et al. | 307/228 |
| 4,250,410 | 2/1981 | Moench et al. | 307/263 |
| 4,264,872 | 4/1981 | Suzuki | 330/253 |
| 4,617,477 | 10/1986 | DePaolis, Jr. | 307/443 |
| 4,634,905 | 1/1987 | Campbell, Jr. | 307/594 |
| 4,638,184 | 1/1987 | Kimura | 307/297 |
| 4,645,946 | 2/1987 | Ishikawa et al. | 307/261 |
| 4,691,120 | 9/1987 | Kondo | 307/608 |

OTHER PUBLICATIONS

"Time Delay Circuit for Pulse Signal", IBM Technical Disclosure Bulletin, vol. 30, No. 3, Aug. 1987, pp. 1183–1186.

Primary Examiner—John S. Heyman
Assistant Examiner—Trong Quang Phan
Attorney, Agent, or Firm—Kinney & Lange

[57] ABSTRACT

A delay circuit for differential signals has input terminals for receiving primary and complementary phases of the differential signals and output terminals upon which the primary and complementary phases of output differential signals are generated after a suitable delay. A differential comparator controls charging and discharging of first and second capacitors, one capacitor being provided for each phase for providing a seleced delay. The time difference between switching of the differential comparator and the subsequent voltage level transistion of the relative charges on the first and second capacitors determines the time delay dt. The delay circuit is compensated for power supply and temperature variation.

11 Claims, 2 Drawing Sheets

DIFFERENTIAL SIGNAL DELAY CIRCUIT

BACKGROUND OF THE INVENTION

1. Field of the Invention.

The present invention relates generally to delay line circuits and more particularly to a differential signal delay line circuit operable at high frequencies.

2. Description of the Prior Art.

Encoded digital signals frequently carry information in the timing, and more particularly, the relative timing between voltage level transitions. Digital signal delay lines must exhibit high fidelity to the timing of signal level transitions and to the timing inter-relationships between transitions to preserve the data being transmitted. High fidelity becomes more critical as signal transmission frequency increases.

Digital signals are commonly transmitted as single ended signals, i.e. only one transmission path is provided. Prior art single-ended delay cells used in delay lines have relatively poor immunity to noise and tend not to exhibit precise repeatability in transition delay timing. In prior art devices, delay is provided by using a differential switch to compare ramp down voltage on a discharging capacitor with a reference voltage. The time taken to discharge the voltage level across the capacitor to the reference signal voltage level provides the delay of the cell. Fast transistor switches control charging of the delay capacitor. Switching of the transistor comes with attendant current spikes. Where a plurality of such delay cells are connected serially, and when current spikes are coupled back to the source of the reference voltage, instability and unpredictability in timing of switching of the subsequent delay cell results. Such delays may be cumulative through the delay cell chain, which results in a possible loss of intelligibility of the signal.

SUMMARY OF THE INVENTION

The present invention provides a delay circuit for digital signals. The digital signal is a differential signal having a primary and complementary phases. Voltage level crossovers of the primary and complementary phases are intelligence equivalents of the voltage level transitions of the single-ended signal. The differential signal delay circuit has input terminals to which the primary and complementary phases are applied, and output terminals upon which the complementary and primary phases are generated after a suitable delay time "dt".

The output signal follows the signals appearing on first and second nodes in the delay circuit. First and second one unit current sources are connected by the first and second nodes to first and second switches, which are controlled by signals applied to the primary and complementary phase input terminals, respectively. The first and second switches operate as a differential switch alternately connecting the first and second nodes to a common node. The common node is connected to a relatively negative power source by a two unit current source.

A first capacitor is connected between the first node and relative ground, and a second capacitor is connected between the second node and the relative ground. Charging and discharging of the first and second capacitors occurs during opposite phase voltage level transitions, immediately following switching of the first and second switches. Voltage level transition between the first and second node is delayed by the capacitors relative to the transition on the input terminals, providing delay "dt" to data transmission.

An input buffer circuit provides control voltages to the current sources to maintain current to current ratios between the current sources at constant values, maintaining the charging and discharge rates of the capacitors and thus keeping "dt" constant.

A clamping control sets minimum and maximum voltage levels on the first and second nodes through clamping circuits disposed within the delay circuit, notwithstanding voltage variation from a power supply. An upper limit voltage clamping circuit comprises one arm of a transistor bridge and a lower limit voltage clamping circuit includes a second arm of a transistor bridge. The transistors in the clamping circuits are controlled by temperature-compensated base currents provided by the clamping control circuit to maintain the voltage levels appearing on the first and second nodes at temperature independent maximum and minimum values. The upper and lower clamping circuits also sink or source current as required to the first and second nodes to maintain voltage levels thereon.

DETAILED DESCRIPTION OF THE PREFERRED EMBODIMENT

Figure 1:
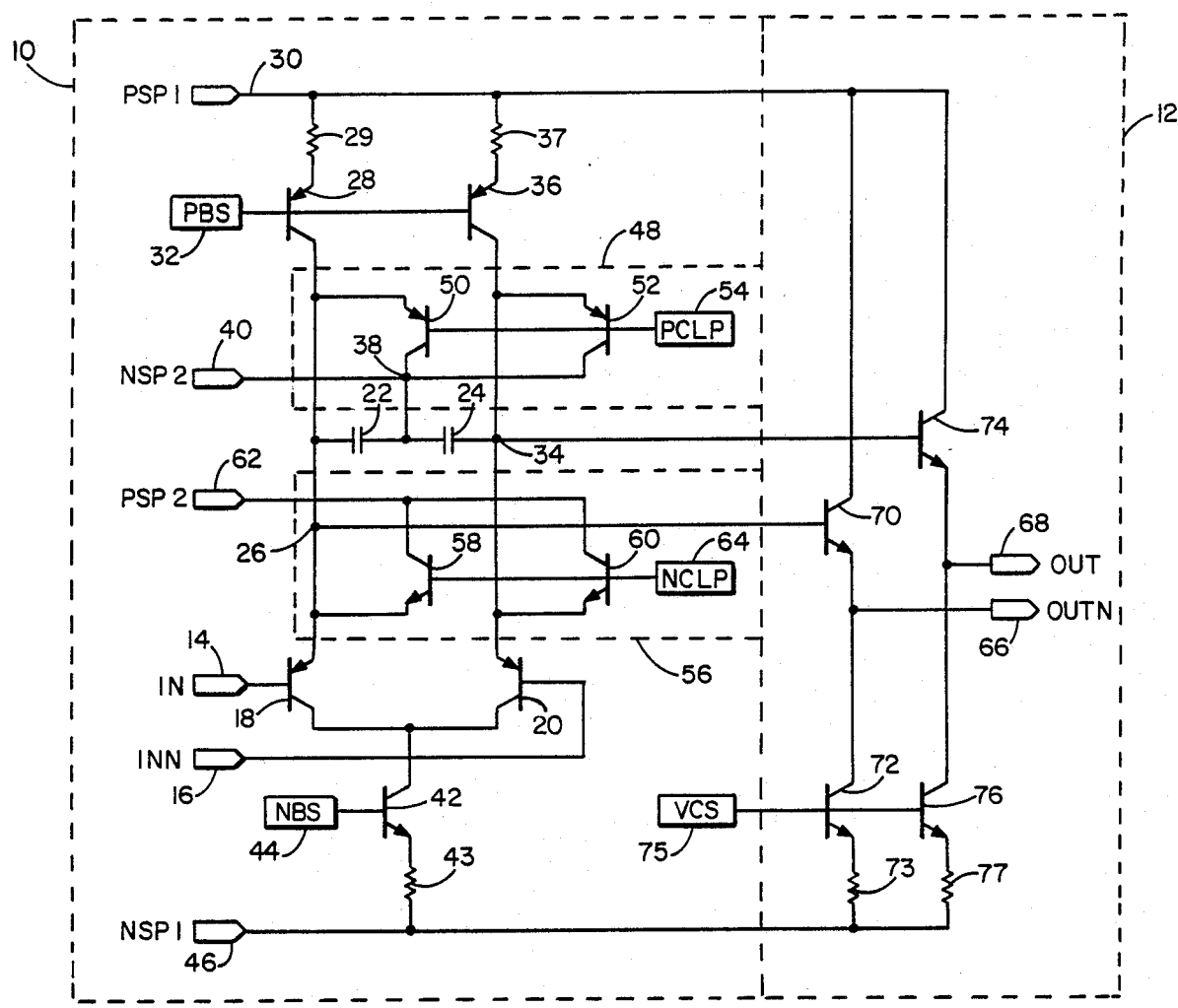
FIG. 1 is a circuit schematic of a preferred embodiment of the delay circuit of the present invention.

FIG. 1 illustrates a differential signal delay circuit 10 with an output buffer 12. Delay circuit 10 and output buffer 12 together produce a differential pair of output signals OUT and OUTN which are derived from and delayed relative to a differential pair of input signals IN and INN. Delay circuit 10 and output buffer 12 use a pair of positive supply voltages PSP1 and PSP2, a pair of negative supply voltages NSP1 and NSP2, and reference voltages PBS, NBS, VCS, PCLP and NCLP.

Differential signal delay circuit 10 receives digital data complementary signals IN and INN on input terminals 14 and 16, respectively. Input terminal 14 is connected to the base of an NPN transistor 18. Input terminal 16 is connected to the base of NPN transistor 20. Transistors 18 and 20 form a differential comparator for controlling the charging and discharging of capacitors 22 and 24.

Transistor 18 is connected at its emitter to node 26 and to the collector of PNP transistor 28. Transistor 28 with resistor 29 form a current mirror connected to first positive supply voltage PSP1 on power rail 30 to provide a current source sensitive to the voltage PBS appearing at node 32 and at the base of transistor 28. Transistor 28 directs one unit of current into node 26.

Similarly, node 34 connects the emitter of PNP transistor 20 and the collector of PNP transistor 36. Transistor 36 with resistor 37 are a current mirror circuit connected to power rail 30 to form a current source for sourcing current into node 34. Transistor 36 is also controlled by PBS.

Capacitor 22 is connected between node 26 and node 38. Capacitor 24 is connected between node 34 and node 38. Node 38 is held at potential level NSP2 supplied at input terminal 40. NSP2 is preferably kept at a level below the minimum clamping level for nodes 26 and 34. When transistor 18 is off, i.e. when IN is low, capacitor 22 is either charging or supporting a clamped maximum voltage on node 26. Capacitor 22 is either discharging or supporting a clamped minimum voltage on node 26 when transistor 18 is on, i.e. when IN or input terminal 14 is low. Capacitor 24 is either charging or supporting a clamped maximum voltage on node 34 when transistor 20 is off, i.e. when INN or node 16 is low. Capacitor 24 is either discharging or supporting a clamped minimum voltage on node 34 when transistor 20 is conducting, i.e. when INN is high.

Transistors 18 and 20 alternately turn on allowing current to flow from nodes 26 and 34, respectively, to the collector of transistor 42. The emitter of transistor 42 is connected by resistor 43 to negative supply voltage NSP1 appearing at negative power supply rail 46. NPN transistor 42 and resistor 43 are a current mirror pair functioning as a current source. The current source draws two units of current from either node 26 or node 34 but not both. Transistor 42 is controlled by a negative reference voltage NBS appearing at node 44. The voltages PBS and NBS appearing on nodes 32 and 44 are related to one another for maintaining a balance of 2:1 in the current ratio between transistor 42 and either transistor 28 or transistor 36.

Clamping of the maximum voltage appearing on nodes 26 and 34 is provided by an upper level or positive clamping circuit 48, which includes PNP transistors 50 and 52. Nodes 26 and 34 are connected to the emitters of PNP transistors 50 and 52, respectively. The collectors of transistors 50 and 52 are connected at node 38 to the relatively negative voltage supply NSP2 at node 40. The maximum voltage which can occur on either node 26 or node 34 is determined by reference voltage PCLP at node 54, which is connected to the bases of transistors 50 and 52. Conduction by transistors 50 and 52 occurs when the potential level appearing on the emitters of the transistors reaches the potential level of PCLP plus one $V_{BE}$ drop (i.e. +0.7 volts). The base-to-emitter voltage differential for transistor 50 is the difference between the voltage level of node 26 and PCLP, and the base-to-emitter voltage differential for transistor 52 is the voltage difference between node 34 and PCLP. Because the voltage difference between base-to-emitter of an PNP transistor cannot exceed an 0.7 volt drop, the maximum voltage appearing on nodes 26 and 34 is equal to the voltage PCLP appearing on node 54 plus about 0.7V.

A minimum or lower level voltage clamping circuit 56 provides a negative lower bound to the voltage appearing on nodes 26 and 34. The collectors of NPN transistors 58 and 60 are connected to a positive voltage source PSP2 at node 26. When the potential appearing on node 26 reaches a potential one $V_{BE}$ below the reference potential NCLP supplied on node 64, transistor 58 begins conducting, drawing current from voltage level PSP2 to node 26. When the potential appearing on node 34 drops one $V_{BE}$ below the potential NCLP appearing on node 64, transistor 60 begins conducting, drawing current from node 62 to node 34. Accordingly, the minimum voltage level on nodes 26 and 34 has a lower bound one $V_{BE}$ below NCLP.

Voltage clamping circuits 48 and 56 source or drain current to or away from nodes 26 and 34 as required, as explained in greater detail below.

Output buffer 12 provides a high impedance output connection to nodes 26 and 34, and output current to support signals on output terminals 66 and 68. Transistor 70 provides a high impedance to node 26, which is connected to the base thereof. Similarly, node 34 is connected to the base of transistor 74. Transistor 70 is connected at its collector to positive power rail 30 and at its emitter to a current mirror formed by transistor 72 and resistor 73. Transistor 74 is connected at its collector to positive power rail 30 and at its emitter to a current mirror formed by transistor 76 and resistor 77. Transistors 72 and 76 sink current to negative power supply rail 48. Output terminals 66 and 68 are taken at the emitters of transistors 70 and 74, respectively.

Transistors 70 and 74 are always conducting. Accordingly, voltage levels appearing at their emitters follow the voltage levels on nodes 26 and 34, respectively, less one $V_{BE}$ drop. Thus, the output signals on output terminals 66 and 68 also follow the voltage levels on nodes 26 and 34, respectively, less $V_{BE}$ voltage drop.

Figure 2:
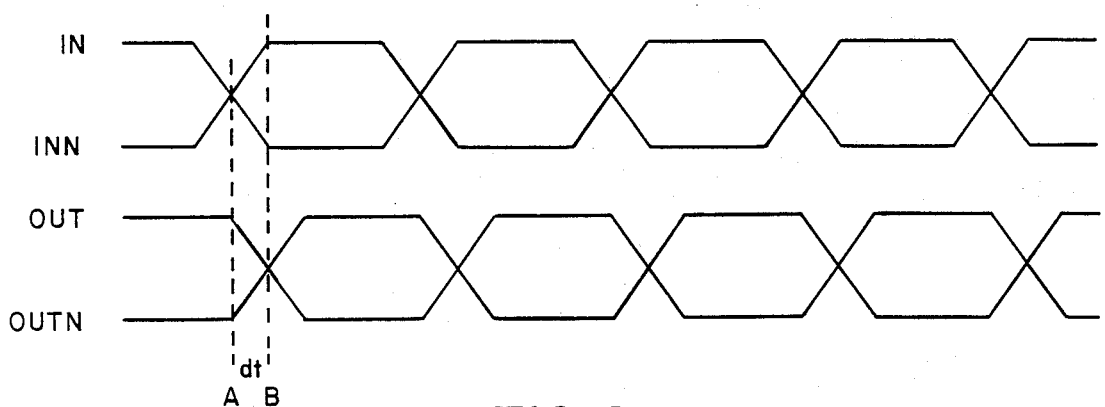
FIG. 2 is a waveform diagram of a differential data signal and a delayed responsive differential signal.

FIG. 2 illustrates timing comparisons between input waveforms and output waveforms of a one stage differential signal delay circuit 10. The operation of differential signal delay circuit 10 is described with reference to both FIGS. 1 and 2. Buffered reference voltage NBS is applied to the base of transistor 42 and buffered reference voltage PBS is provided to the bases of transistors 28 and 36. NBS and PBS are temperature and supply voltage compensated. The current sources formed with transistors 28 and 36 each supply one unit of current into nodes 26 and 34, respectively. The current source formed with transistor 42 drains two units of current from node 26 or node 34, depending upon which of transistors 18 and 20 is conducting. The clamp reference voltages PCLP and NCLP appearing at nodes 54 and 64, as well as PBS and NBS, are controlled by circuitry described later with reference to FIG. 3. The voltage references PCLP and NCLP are substantially constant.

Initially, delay circuit 10 is assumed to be in equilibrium. The signals IN and INN appearing on input terminals 14 and 16 are complementary differential signals of constant value. It may be assumed that the signal IN on terminal 14 is relatively positive with respect to the signal INN on terminal 16. IN and INN are assumed to have been at substantially constant values for a period of time exceeding the time required for the voltage levels appearing at nodes 26 and 34 to reach their respective clamped levels, determined by the values of PCLP and NCLP, respectively.

In the initial equilibrium state of delay circuit 10, transistor 18 is conducting and transistor 20 is nonconducting. Transistor 42 draws two units of current from node 26 through transistor 18. Transistor 28 provides one-half of the current drawn from node 26 to the node. Transistor 58 is conducting, clamping the voltage level on node 26 at the minimum permitted level, NCLP less one $V_{BE}$ drop across the base-to-emitter junction of NPN transistor 58. Capacitor 22 is in equilibrium and does not support current drawn by transistor 42. The required unit of current is provided node 26 through transistor 58 from power supply PSP2 at node 62. The output signal OUTN on output terminal 66 holds a steady state voltage value one $V_{BE}$ drop across the base-to-emitter junction of transistor 70 from node 26. Transistor 50, connected at its collector and its emitter, respectively, between node 26 and node 40, is nonconductive.

The voltage level on node 34 is clamped at the maximum permitted value in the initial equilibrium state. Transistor 52 is in a conducting state permitting a maximum voltage level on node 34 equal to the voltage level of PCLP plus one $V_{BE}$ drop across the emitter to base junction of PNP transistor 54. Transistor 36 directs one unit of current into node 34, which is sunk from node 34 through transistor 52 to negative power supply NSP2. Capacitor 34 is in equilibrium, i.e. neither charging or discharging. Transistor 60, connected by its emitter and its collector between node 34 and node 62, is nonconductive.

A transition in the differential input signals, reversing the relative polarities of the potentials of IN and INN is reflected by a reversal of polarities in output signals OUT and OUTN after a delay "dt." Collectively, signals IN and INN have a trapezoidal waveform wherein transitions are characterized by substantially linear ramping between minimum and maximum values. Output signals OUT and OUTN also exhibit a trapezoidal form following the ramping of voltage levels at nodes 26 and 34, which ramp after transition of IN and INN as capacitors 22 and 24 charge and discharge, respectively.

Transistors 18 and 20 switch conductive states in response to a voltage level transition indicated by the letter A, disconnecting output node 26 from transistor 42 and connecting output node 34 through transistor 20 to the collector of transistor 42. Capacitor 22 will begin to charge and the resultant rise in voltage appearing on node 26 will cause transistor 58 to become nonconducting. Current from transistor 28 will continue to charge capacitor 22 until the voltage on node 26 is clamped at the maximum by transistor 50.

Simultaneously, the potential appearing on node 34 will begin to drop as transistor 20 draws charge therefrom resulting in transistor 52 becoming nonconductive. Transistor 42 draws one-half of its current through transistor 36 and one-half from capacitor 24. The voltage levels appearing at node 34 ramps down. The voltage level on node 34 clamps at lower bound NCLP plus one $V_{BE}$ drop by transistor 60.

The time delay dt of delay circuit 10 is the period between the crossover of IN and INN and the crossover of OUTN and OUT, indicated between letters A and B in FIG. 2. The voltage level on node 26 rises as capacitor 22 charges, until transistor 50 begins to conduct, transmitting current from node 26 to negative supply NSP2 at node 40. Transistor 50 sinks all current from transistor 28 and clamps the voltage on node 26 at the level PCLP appearing on node 62 plus one $V_{BE}$ drop. Simultaneously, as node 34 approaches the voltage level equal to the level NCLP appearing on node 40 less one $V_{BE}$ drop appearing on transistor 60, transistor 60 will begin to conduct to satisfy current drawn by transistor 42 no longer met from capacitor 24. Accordingly, the voltage on node 34 will clamp at a level one $V_{BE}$ below the voltage NCLP appearing on node 40. Ramping of the voltage levels appearing on nodes 26 and 34 begins when IN and INN crossover. The slope of the voltage level ramps is a function of the capacitance of capacitors 22 and 24, and of the total current flowing through the current sources in delay circuit 10.

Figure 3:
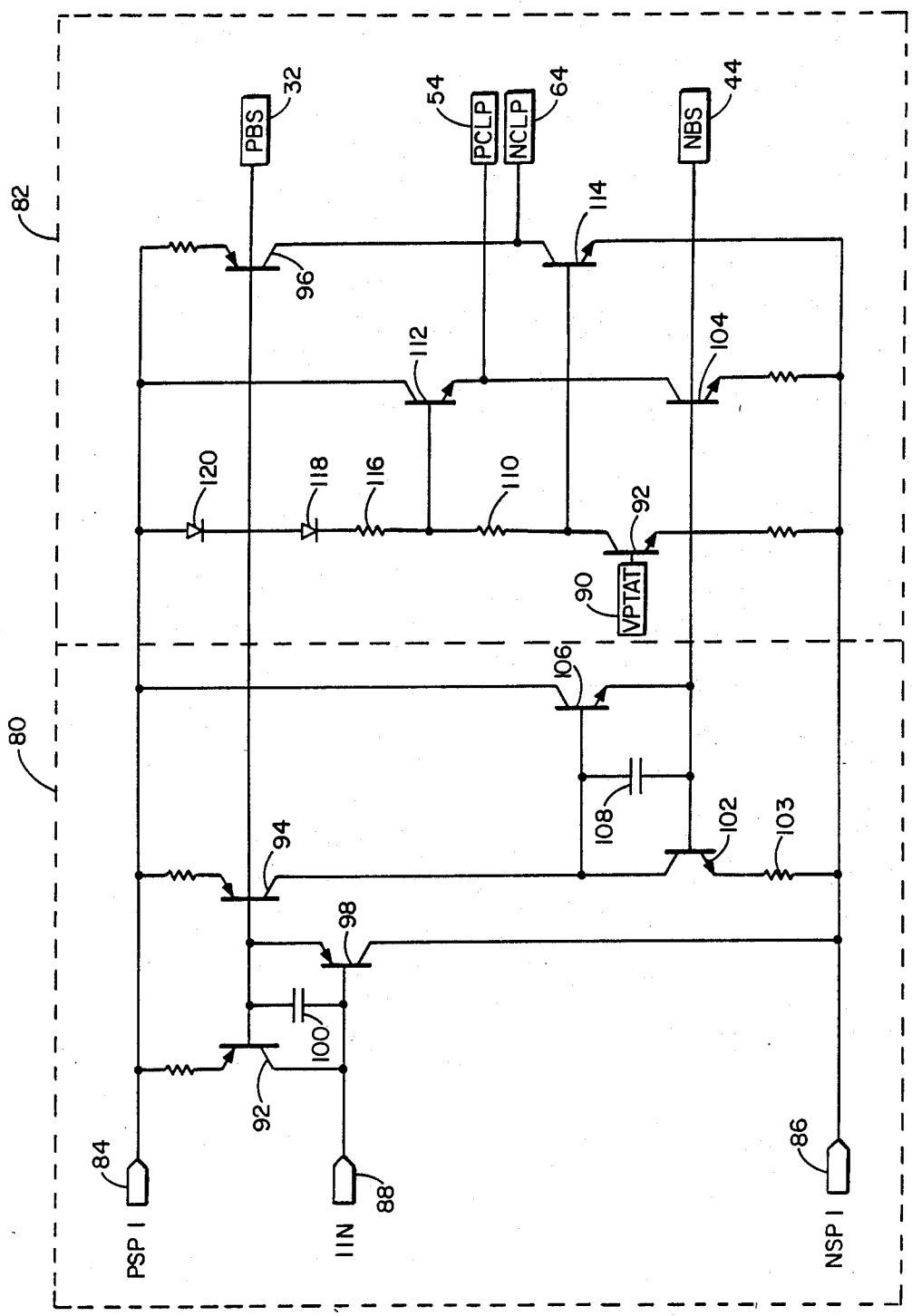
FIG. 3 is a circuit schematic of an input buffer and a clamping control circuit for use with the delay circuit of FIG. 1.

FIG. 3 illustrates a buffer circuit 80 and a clamping control circuit 82 used to produce reference voltages PBS, NBS, PCLP and NCLP. Those skilled in the art will realize that many other buffer circuits and clamping control circuits with similar functions to those circuits 80 and 82 can be used with the present invention.

Circuits 80 and 82 are connected between power supply rails 84 and 86, which may be the same as power supply rails 30 and 46 shown in FIG. 1. The reference output voltages PBS, PCLP, NCLP and NBS are generated on nodes 32, 54, 64 and 44, respectively, which correspond to the nodes of the same numbers in FIG. 1. Control voltage IIN is applied input node 88 and control voltage VPTAT is applied at input node 90.

Variations in the voltage differential between power supply rails 84 and 86 are reflected in the control voltage IIN appearing on node 88. Buffer 80 provides output potentials PBS and NBS unaffected by relative degradation between PSP1 and NSP1 on rails 84 and 86.

Transistors 92, 94, 96, 28 (shown in FIG. 1), and 36 (shown in FIG. 1) are all matched PNP transistors. Node 32 is common to the bases of transistors 92, 94, 96, 28 and 36. Node 88 is connected to the collector of PNP transistor 92 for providing a collector current for the transistor. Control signal IIN thus provides the control current for current mirrors comprising transistors 92 and 94, transistors 92 and 96, transistors 92 and 28, and transistors 92 and 36, respectively.

PNP transistor 98 is connected at its emitter to node 32 and at its collector to negative power rail 86 for sinking the base currents of transistors 92, 94, 96, 28 and 36. Capacitor 100 connected between node 32 and node 88 filters high frequency transient variations of IIN.

Transistor 94 is connected in series with a current source comprising transistor 102 between power rail 84 and negative power supply rail 86. The voltage level on the base of transistor 102 (i.e. NBS) is a function of the collector current of transistor 102, the voltage drop between the emitter of transistor 102 and NSP and supply voltage NSP on rail 86. The functional relationship for the voltage level of NBS is:

$$, NSP + [Ic(T102) \times R(R103)] + V_{BE}(T102) \times NBS$$

where:
Ic (T102) is the collector current of transistor 102;
R(R103) is the resistance in ohms of resistor 103; and
$V_{BE}$(T102) is the voltage drop across the base to emit a junction of transistor 102.

Transistor 102 forms a current mirror with transistor 104 and a current ratio mirror with transistor 42. Transistor 42 draws twice the current that transistor 102 draws. The voltage level of signal NBS tracks changes in current through transistors 28 and 36 for maintaining the ratio of current drawn by transistors 28 and 36 against the current drawn by transistor 42. Transistor 106, connected at its emitter to node 44 and at its collector to rail 84, provides the base currents of transistors 102, 104 and 42. Capacitor 108, connected between node 44 and the base of transistor 106, filters transients on node 44.

Clamping voltage reference circuit 82 provides clamping reference signals PCLP and NCLP on nodes 54 and 64, respectively. Generation of differential signal OUT and OUTN by delay circuit 10 requires a constant voltage differential between PCLP and NCLP. The voltage difference between PCLP and NCLP is equal to the voltage drop across resistor 110 less two base-to-emitter voltage drops caused by transistors 112 and 114. Accordingly, an essential function of reference circuit 82 is to maintain a constant current through resistor 110, resistor 110 being relatively immune to temperature changes with respect to resistance changes.

A current source provided by transistor 92 has a temperature coefficient which is a known function of temperature in Kelvins. Resistor 110 has a known temperature dependent resistance. VPTAT, supplied to the base of transistor 92 through node 90, is temperature compensated for providing a constant voltage drop across resistor 110. Transistor 92 has an emitter coupled to negative rail 86. The collector of transistor 92 is connected in series with resistor 110, resistor 116, diode 118 and diode 120 to positive rail 84. Resistor 116, diode 118 and diode 120 are selected to have temperature related properties to correct PCLP and NCLP to desired absolute values relative to PSP.

The current source including transistor 104 is connected in series with transistor 112 from negative rail 86 to positive rail 84. The current source including transistor 96 is connected in series with PNP transistor 114 from positive rail 82 to negative rail 86. The opposite terminals of resistor 110 are connected to the bases of transistor 112 and 114. The emitters of transistors 112 and 114 are connected to nodes 54 and 64, respectively. Accordingly, the difference between PCLP and NCLP tracks the voltage difference between the terminals of resistor 110 allowing for base-to-emitter drops of transistors 112 and 114. Transistors 112 and 114 buffer the terminals of resistor 110 from nodes 54 and 64. Transistor 96 as a source of current to voltage clamping circuit 56. Transistor 104 sinks current from voltage clamping circuit 48.

The present invention provides for a delay measured by crossover of true differential signals and not by a single ended signal compared with a reference voltage. This provides far better noise immunity and repeatability. The buffered output of the delay circuit 10 is easily interfaced with current mode logic levels. The delay circuit is easily sectioned for optimal layout within a large scale integrated circuit.

Although the present invention has been described with reference to preferred embodiments, workers skilled in the art will recognize that changes may be made in form and detail without departing from the spirit and scope of the invention.

What is claimed is:

1. A phase transition delay circuit for a differential signal with a primary phase and a complementary phase, the delay circuit comprising:
   primary phase and complementary phase input terminals for receiving the differential signal;
   a primary node and a complementary node;
   a first voltage controlled current source connected to the primary node;
   a second voltage controlled current source connected to the complementary node;
   first capacitive means connected to the primary node;
   second capacitive means of substantially the same capacitance as of as the first capacitive means connected to the complementary node;
   means coupled to the primary and complementary nodes for clamping the maximum voltage levels thereon at a predetermined level;
   means coupled to the primary and complementary nodes for clamping the minimum voltage levels thereon at a predetermined level;
   a voltage controlled current sink; and
   comparator means connected to the input terminals for connecting the complementary node to the current sink when the primary phase is more positive than the complementary phase and for connecting the primary node to the current sink when the complementary phase is more positive than the primary phase;
   wherein the first and second voltage controlled current sources provide current at substantially the same rate and wherein the current sink sinks a current having a magnitude substantially equal to the sum of the currents from the first and second voltage controlled current sources.

2. The delay circuit of claim 1 wherein the comparator means further comprises:
   a primary phase switch connected between the primary node and the current sink responsive to the voltage level of the primary phase of the differential signal for connecting and disconnecting the primary node with the current sink; and
   a complementary phase switch connected between the complementary node and the current sink responsive to the voltage level of the complementary phase of the differential signal for connecting and disconnecting the complementary node with the current sink.

3. The delay circuit of claim 1 and further comprising means for applying voltage control signals to the first and second current sources and the current sink for balancing currents.

4. The delay circuit of claim 1 wherein the maximum voltage level clamping means drains one unit of current from a node when the voltage therein reaches the maximum level.

5. The delay circuit of claim 1 wherein the minimum voltage level clamping means sources one unit of current into a node when the voltage therein reaches the minimum clamped level.

6. A differential signal delay circuit for preserving the timing relationship of voltage level crossovers between a primary and a complementary phase of a differential logic signal, the differential signal delay circuit comprising:
   first and second input terminals for receiving the primary and complementary phases of the differential logic signal;
   first and second output nodes;
   a terminal for receiving a first reference voltage;
   first and second matched capacitors connected from the first output node and the second output node to the terminal for receiving the first reference voltage, respectively;
   a first current mirror circuit supplying current to the first and second output nodes;
   a second current mirror circuit for draining current from the first and second output nodes;
   a current switching circuit connected to the first and second output nodes to control charging and discharging of the first and second capacitor circuits; and
   a voltage controlled clamp circuit connected to the first and second output nodes for limiting the voltage levels on the nodes to predetermined minimums and maximums.

7. A differential signal delay circuit as defined in claim 6 and further comprising:
   terminals for receiving relatively positive and negative voltages;
   the voltage controlled clamp circuit including a transistor bridge circuit;
   the transistor bridge circuit including a first maximum voltage level clamp transistor connected between the first output node and the positive voltage source, a second maximum voltage level clamp transistor connected between the second output node and the positive voltage source, a first minimum voltage level clamp transistor connected between the first output node and the negative voltage source, and a second minimum voltage level clamp transistor connected between the second output node and the negative voltage source; and an input buffer circuit for providing compensated control signals to control electrodes of the transistors of the transistor bridge, the compensated control signals being related to maximum and minimum voltage levels determining the range of voltages appearing on the first and second output nodes.

8. A differential signal delay circuit as defined in claim 7 wherein the first current mirror circuit comprises:
   a first current source connected to the first output node;
   a second current source connected to the second output node; and
   a current source programming circuit providing control currents to the first and the second current sources such that the currents through the first and second current sources are of substantially the same magnitude.

9. A differential signal delay circuit as defined in claim 8 wherein the second current mirror circuit comprises a current drain configured to draw substantially twice the current supplied by either the first current source or the second current source.

10. A differential signal delay circuit as defined in claim 9 wherein the current switching circuit is responsive to the relative polarity of the phases of the differential logic signal for connecting the current drain of the second current mirror circuit to the first output node or to the second output node, respectively.

11. A differential signal delay circuit as defined in claim 7, wherein the input buffer circuit further includes:
   a power supply;
   a circuit providing temperature compensated control signals to the maximum and minimum voltage level clamp transistors; and
   a circuit buffering the control signals such that they are substantially unaffected by power supply voltage level variation.

* * * * *